US006872994B2

(12) United States Patent
Suk

(10) Patent No.: US 6,872,994 B2
(45) Date of Patent: Mar. 29, 2005

(54) SEMICONDUCTOR DEVICE HAVING AN ACTIVE REGION WHOSE WIDTH VARIES

(75) Inventor: Jong-Wook Suk, Hwaseong-gun (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/728,839

(22) Filed: Dec. 8, 2003

(65) Prior Publication Data

US 2004/0119167 A1 Jun. 24, 2004

(30) Foreign Application Priority Data

Dec. 10, 2002 (KR) .................................. 10-2002-0078226

(51) Int. Cl.[7] .............................................. H01L 29/76
(52) U.S. Cl. ...................... 257/288; 257/296; 257/510
(58) Field of Search ................................ 257/288, 296, 257/297, 349, 506, 510

(56) References Cited

U.S. PATENT DOCUMENTS

| 5,777,370 | A | * | 7/1998 | Omid-Zohoor et al. | ...... 257/374 |
| 5,903,030 | A | * | 5/1999 | Kim | ............................ 257/355 |
| 6,057,187 | A | * | 5/2000 | Jen et al. | ..................... 438/239 |
| 6,656,808 | B2 | * | 12/2003 | Kwean | ........................ 438/305 |
| 2004/0004257 | A1 | * | 1/2004 | Lee et al. | ................... 257/390 |

* cited by examiner

Primary Examiner—T. N. Quach
(74) Attorney, Agent, or Firm—Volentine Francos & Whitt PLLC

(57) ABSTRACT

A semiconductor device of the present invention has an active region whose width varies. Gate electrodes cross over narrowest portions of the active region. Therefore, the device is not prone to producing leakage current even when the line width of the gate electrodes is small.

15 Claims, 10 Drawing Sheets

SEMICONDUCTOR DEVICE HAVING AN ACTIVE REGION WHOSE WIDTH VARIES

BACKGROUND OF THE INVENTION

1. Field of the Invention

The present invention relates to a semiconductor device. More specifically, the present invention relates to the active region where a transistor is formed on a semiconductor substrate.

2. Description of the Related Art

A transistor is a main component of a semiconductor chip and comprises source and drain regions and a gate electrode. As an example, a transistor may be used to access a cell capacitor of a semiconductor memory device such as a DRAM. In this application, if a voltage greater than a threshold voltage is impressed across the gate electrode of the transistor, a path along which current can flow (i.e., a channel) is formed between the source and the drain regions. Accordingly, information can be stored in or read from the cell capacitor along such a channel. On the other hand, the memory device is considered to malfunction if current flows between the source and the drain regions before a threshold voltage is impressed across the gate electrode.

However, conventional semiconductor devices have a limitation that will now be explained with reference to FIG. 1. In manufacturing a conventional semiconductor device, a semiconductor substrate is etched to form a trench having a predetermined depth. A device isolation region 18 is formed by filling the trench with insulation material. An active region 20 is defined by the isolation region 18. Gate electrodes 24 are formed so as to extend over the active region 20 and the device isolation region 18. Impurity ions are implanted into the active region exposed by the gate electrodes 24 to form source and drain regions.

In the case of a conventional semiconductor device, the active region 20 is linear and has a uniform width as measured in the direction along which the gate electrodes 24 run. That is, a central part 20A of the active region located between the gate electrodes 24, ends 20B of the active region, and channel parts 20C of the active region have identical widths a, b and c.

In a conventional semiconductor memory device having an active region as described above, the threshold voltage of the transistor is dictated by the minimum line width Lg of the gate electrode. Accordingly, as semiconductor devices become more highly integrated, the minimum line width Lg of the gate electrodes decreases. That is, the exposed active regions 20A and 20B become larger while the threshold voltage becomes smaller. Highly integrated devices having correspondingly small threshold voltages are prone to producing leakage current that causes the devices to malfunction. The threshold voltage could be increased to solve the problem of leakage current by merely producing a device having a larger minimum line width Lg. However, in this case, the exposed active regions 20A and 20B would have a correspondingly smaller area, whereby the device would offer increased resistance. That is, less current would flow through the source and the drain regions when the transistor is turned on.

SUMMARY OF THE INVENTION

One object of the present invention is to provide a highly integrated transistor having excellent characteristics.

Another object of the present invention is to provide a semiconductor device having an active region that minimizes leakage current even when the device is highly integrated.

Still another object of the present invention is to provide a semiconductor device comprising a transistor wherein the threshold voltage can be high without a corresponding increase in resistance.

Yet another object of the present invention is to provide a semiconductor device having an active region that facilitates the forming of a COB structure.

According to one aspect of the present invention, the active region is laid out along the direction of a first axis, and has a width that varies as measured in the direction of a second axis along which gate electrodes extend across the active region. The gate electrodes basically cross over the narrowest portions of the active region.

Therefore, in the case of a highly integrated device wherein the gate electrode has a small line width, a high threshold voltage can be maintained. Thus, leakage current which is especially problematic in highly integrated devices is suppressed, i.e., device malfunctions are prevented. In addition, the portion of the active region that is not overlapped by the gate electrode is relatively wide. Accordingly, the resistance is low so that a sufficient amount of current will flow between the source and the drain regions. That is, the device can operate at a high speed.

According to another aspect of the present invention, a pair of gate electrodes cross over the active region as extending parallel to and spaced apart from each other. Therefore, the active region is basically divided into three sections, that is, an active region central part between the gate electrodes, a pair of active region end parts disposed to the outside of the gate electrodes, and a pair of active region channel parts over which the gate electrodes extend. In this case, the width of the central part of the active region is greater than that of the pair of active region end parts. In addition, the width of the pair of active region end parts is greater than that of the pair of active region channel parts.

The active region central part is doped by an ion implantation process to serve as a drain region. The active region end parts serve as source regions. That is, the gate electrodes share the drain region located between the source regions. The active region channel part under each of the gate electrodes, i.e. the region between a respective source region and the drain region, provides a path (channel) for current to flow between the source and drain regions. Accordingly, a pair of transistors is formed at the active region.

A bit line is electrically connected to the drain region and capacitors are electrically connected to the source regions, respectively. In this case, the capacitors are located over the bit line wherein a capacitor over bit line (COB) structure is realized.

BRIEF DESCRIPTION OF THE DRAWINGS

FIGS. 3A–10 show a method of forming a semiconductor device according to the present invention, wherein FIGS. 3A, 4A, 5A, 6A, 7A and 8A are plan views of the semiconductor substrate throughout the course of manufacture, FIG. 9 is a cross-sectional view of a transistor of the device, and FIG. 10 is a cross-sectional view of the final device.

DETAILED DESCRIPTION OF THE PREFERRED EMBODIMENTS

Figure 1:
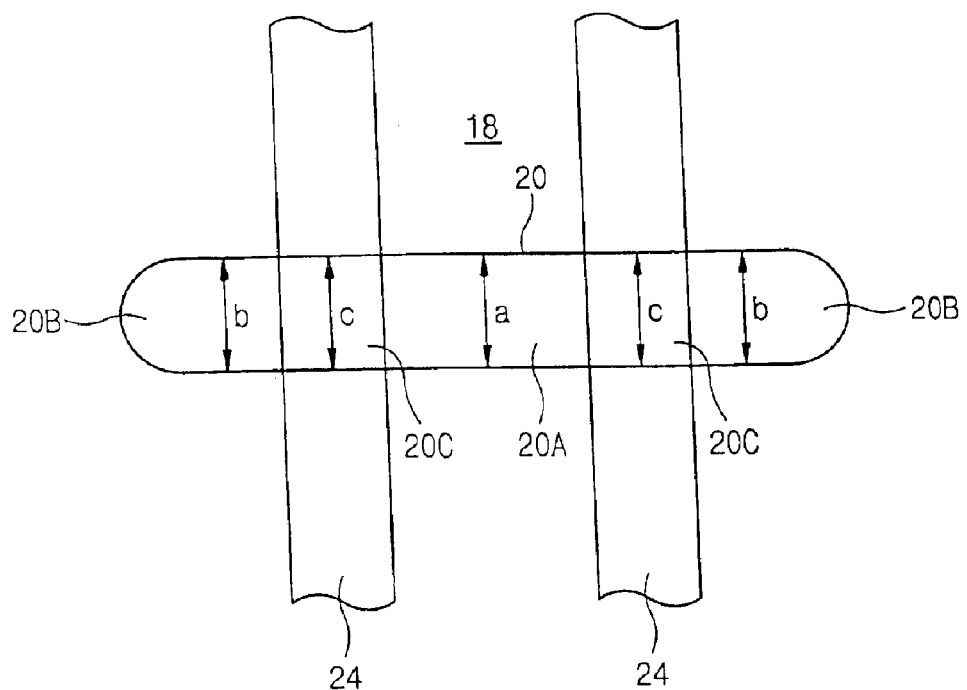
FIG. 1 is a schematic plan view of a semiconductor substrate in a conventional transistor.

The present invention will now be described more fully hereinafter with reference to the accompanying drawings. In the drawings, the thickness of layers and regions are exaggerated for clarity. Also, like numbers designate like elements throughout the drawings. It will also be understood that when a layer is referred to as being "on" another layer or substrate, the description encompasses both the layer in question being disposed directly on the other layer or substrate, or another layer(s) being present therebetween.

Figure 2:
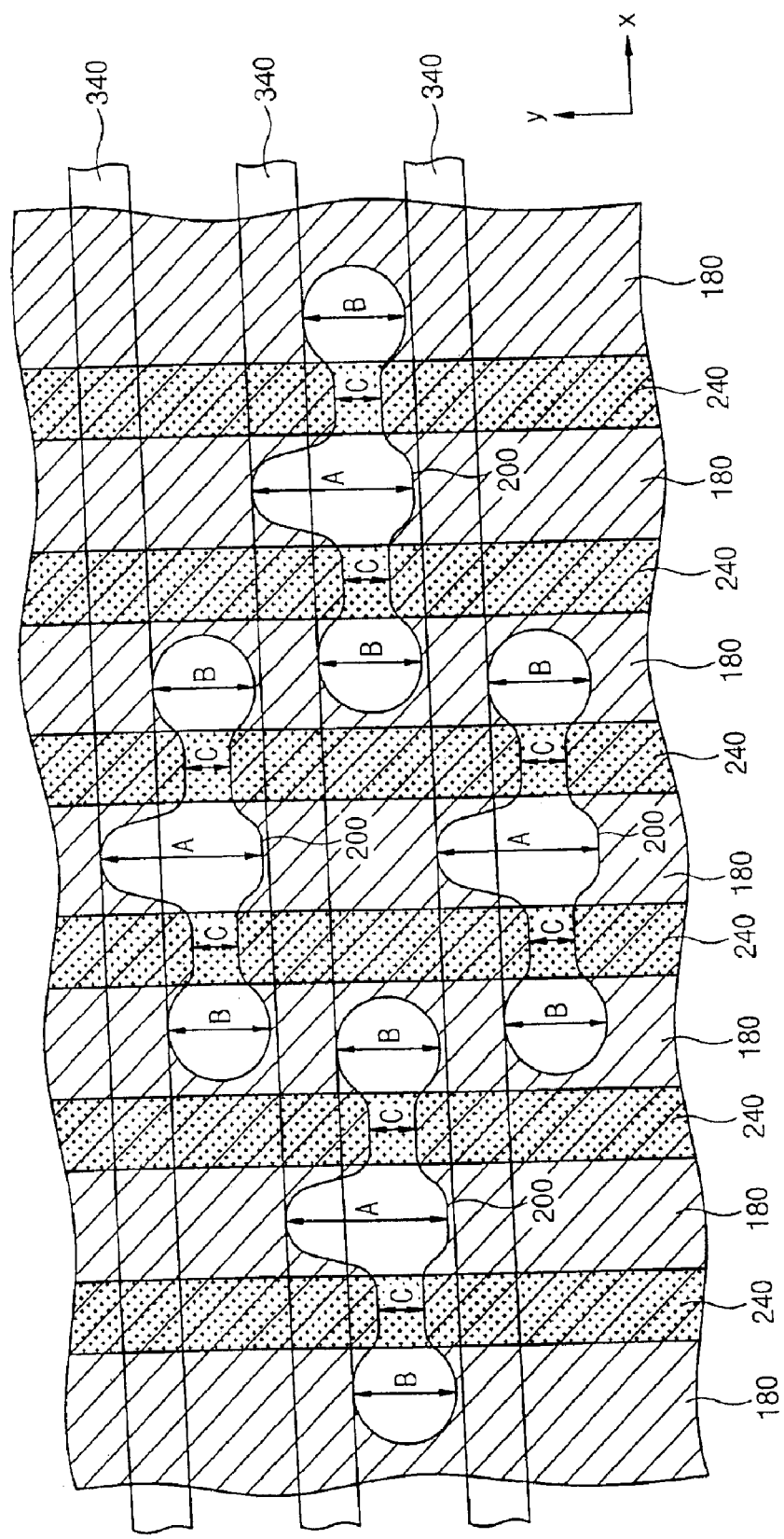
FIG. 2 is a schematic plan view of a transistor according to the present invention.

Referring now to FIG. 2, active regions 200 are formed on a semiconductor substrate in a predetermined pattern. The active regions 200 are electrically insulated by a device isolation region 180. Gate electrodes 240 cross over the active regions 200 and the device isolation region 180 as parallel to and spaced from each other. Bit lines 340 also cross over the active regions 200 and the device isolation region 180 as parallel to and spaced from each other. The bit lines 340 extend at right angles to the gate electrodes 240 (in the direction of the x-axis in the figure).

The width of each active region 200 varies. The width of the active region 200 refers to the dimension that is measured in the direction along which gate electrode 240 extends (i.e., the dimension that is measured in the direction of the y-axis). The gate electrodes 240 cross over those portions of the active regions that have the smallest width.

More specifically, a pair of gate electrodes 240 crosses over each of the active regions 200. Therefore, each active region 200 is divided into three parts, namely an active region central part 200A located between the pair of gate electrodes 240, a pair of active region end parts 200B, and a pair of active region channel parts 200C where the gate electrodes 240 cross over the active region (see FIG. 6A). The active region channel parts 200C connect the active region central part 200A to the active region end parts 200B, respectively.

The drain region and the source region are formed in the active region central part 200A and the active region end parts 200B, respectively. The active region channel part 200C is thus located between the source and drain regions where the channel is formed that is used to conduct current. The bit line 340 is electrically connected to the active region central part 200A, i.e. to the drain region. A capacitor (not shown in the figure) is electrically connected to each active region end part 200B.

The width C of each active region channel part 200C is narrower than the width A of the active region central part 200A and the width B of each active region end part 200B. In addition, the width A of the active region central part is preferably greater than the width B of each active region end part 200B. Therefore, a capacitor over bit line (COB) structure can be easily attained.

A method of fabricating a semiconductor device having the structure described above will be explained hereinafter with reference to FIGS. 3A through 10. Only one active region is illustrated in these figures for clarity.

Figure 3A:
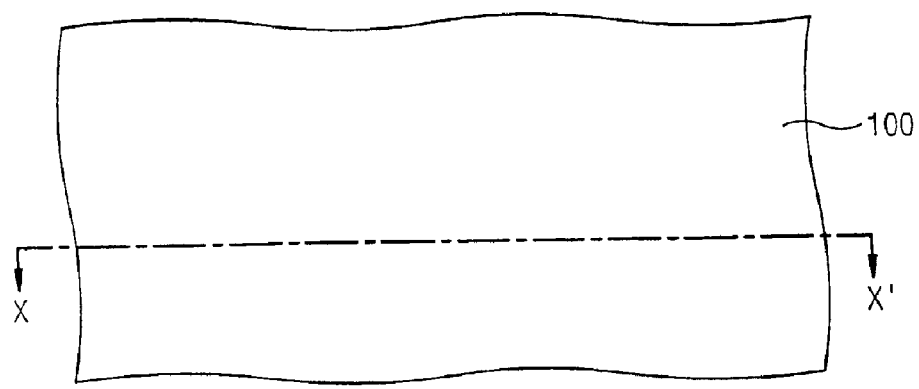
Figure 3B:
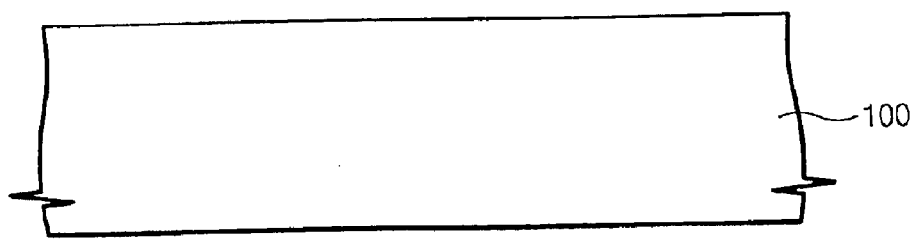
FIGS. 3B, 4B, 5B, 6B, 7B and 8B are corresponding cross-sectional views taken in the direction of line X–X' of FIG. 3A.
Figure 4A:
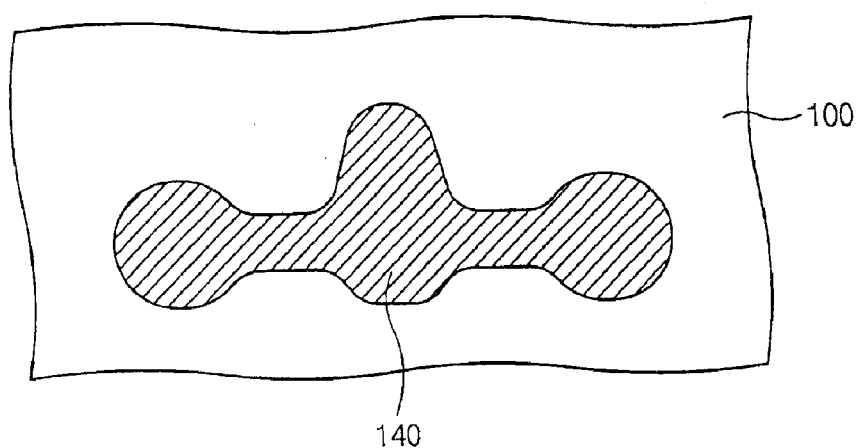
Figure 4B:
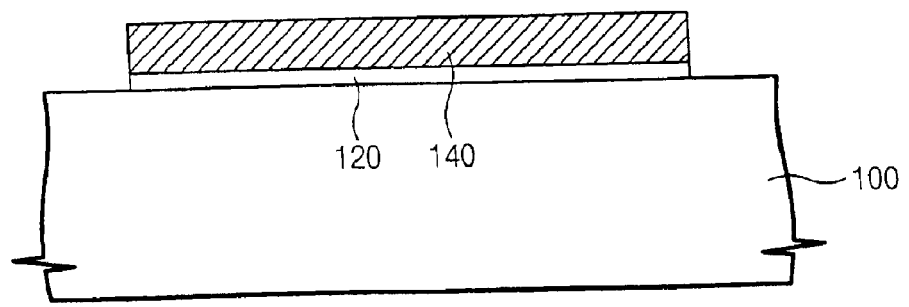

Referring first to FIGS. 3A and 3B, a semiconductor substrate 100 is prepared. The semiconductor substrate 100 is a single crystalline silicon substrate produced by a conventional method.

Next, the semiconductor substrate 100 is subjected to a device isolation process to define an active region thereon. More specifically, referring to FIGS. 4A through 4B, etching mask patterns, i.e., a pad oxide pattern 120 and a mask nitride pattern 140, are formed on the semiconductor substrate 100. The portion of the semiconductor substrate that is covered with the etching mask patterns 120 and 140 will become the active region and the portion of the semiconductor substrate 100 that is not covered with the etching patterns 120 and 140 will become the device isolation region. That is, the etching mask patterns 120 and 140 determine the shape of the active region.

Figure 5A:
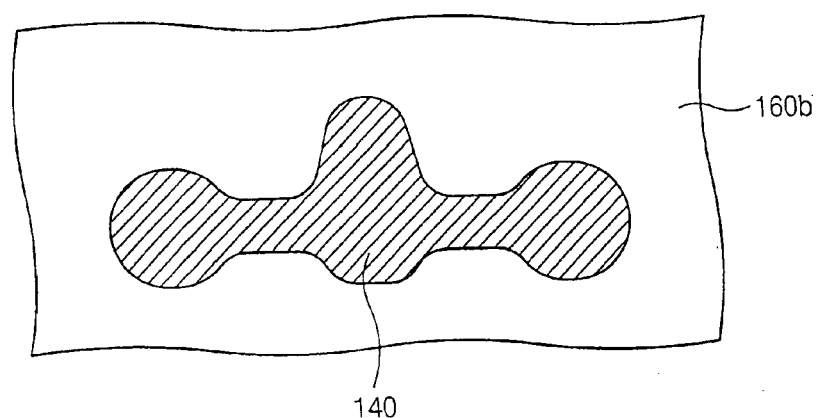
Figure 5B:
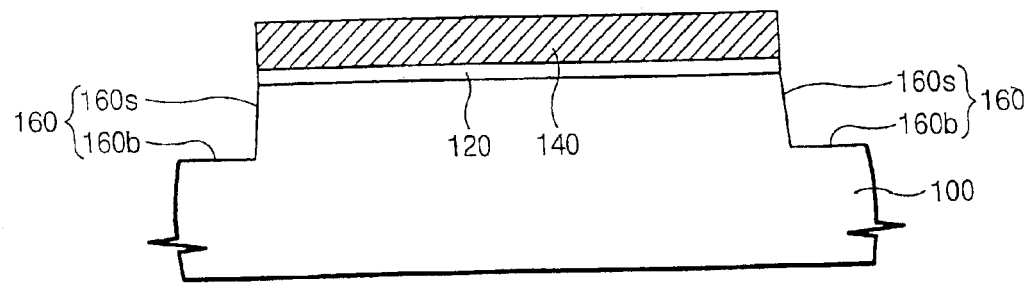

Referring to FIGS. 5A and 5B, the exposed semiconductor substrate is etched using the etching mask patterns 120 and 140 as an etching mask to form a trench 160. The trench 160 is defined by a sidewall 160s and a bottom wall 160b.

Figure 6A:
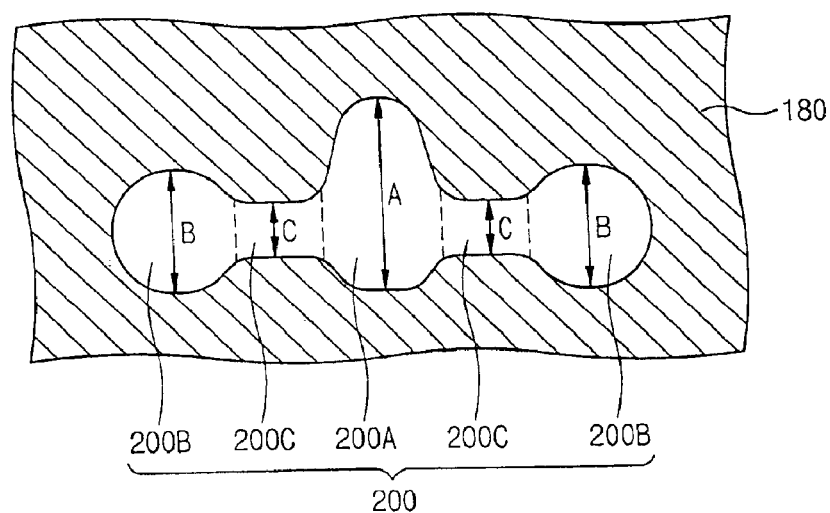
Figure 6B:
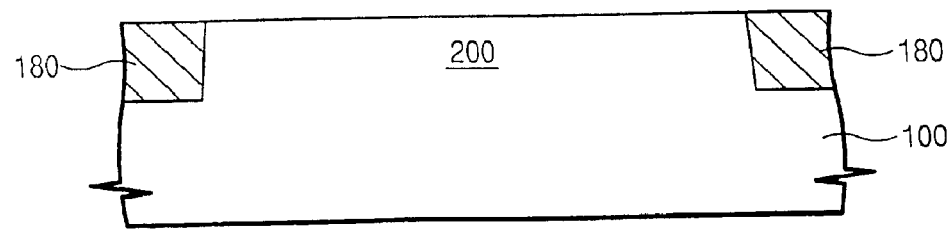
Figure 7A:
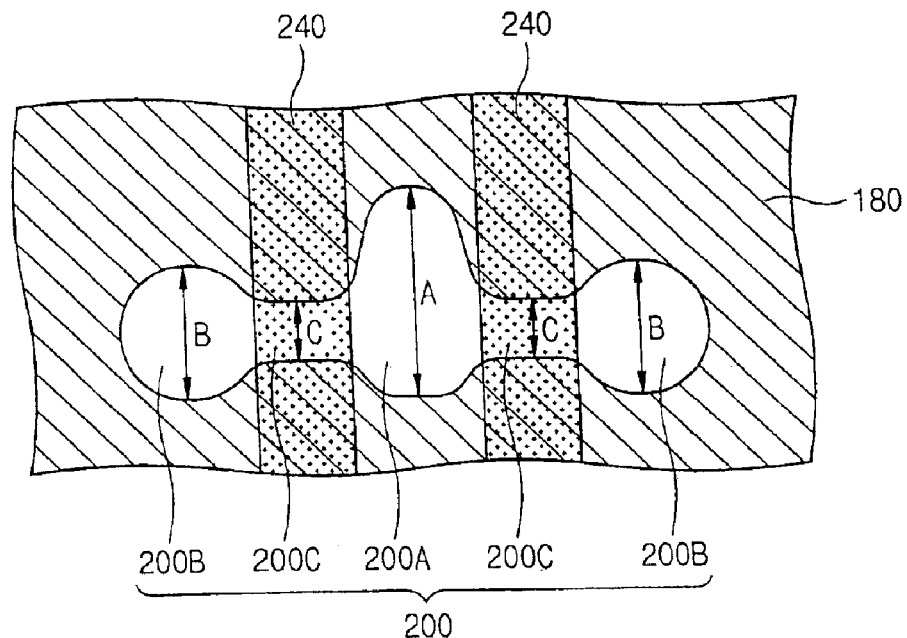
Figure 7B:
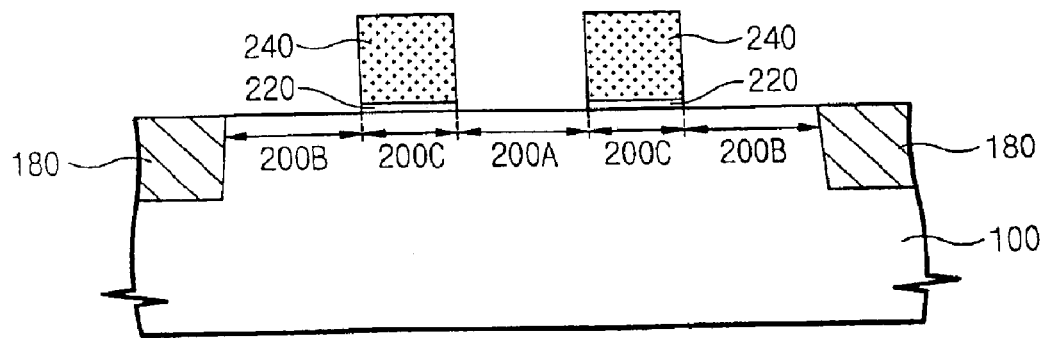

Referring to FIGS. 6A and 6B, the trench 160 is filled with an insulation material to form a device isolation region 180. Therefore, an active region 200 is formed as surrounded by the device isolation region 180. The shape of the active region 200 is the same as that described above in connection with FIG. 2.

Next, a process for forming transistor will be described with reference to FIGS. 7A through 8B. A gate insulation layer 220 is formed on the semiconductor substrate 100, specifically, on each active region channel part 200C. After the device isolation structure is completed, the gate electrodes 240 are formed as electrically insulated from the semiconductor substrate 100 by the gate insulation layer 220. As mentioned above, the gate electrodes 240 cross over the active region channel parts 200C which are the narrowest parts of the active region 200.

Figure 8A:
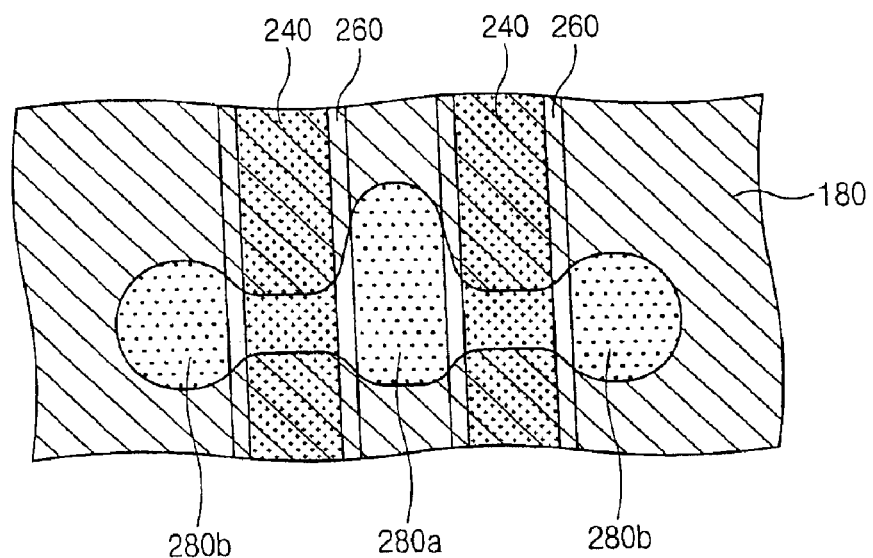
Figure 8B:
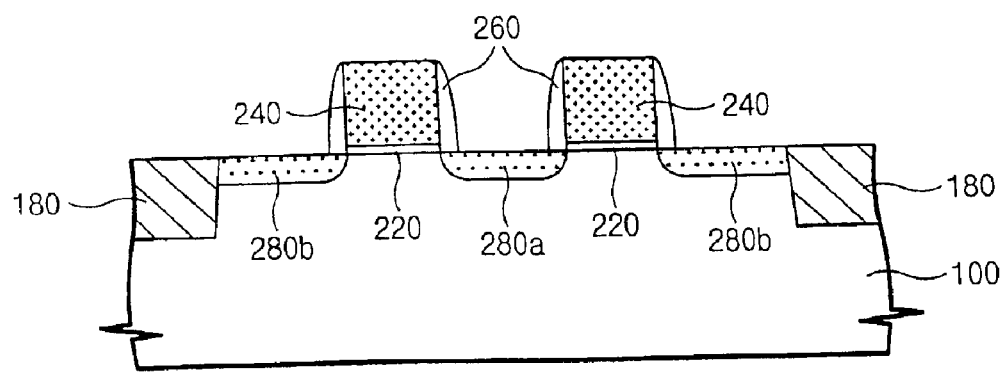

Referring to FIGS. 8A and 8B, insulation sidewall spacers 260 are formed on the sidewalls of the gate electrodes 240. The insulation spacers 260 are formed of material having an etch selectivity with respect to an oxide interlayer insulation layer formed in a subsequent process. For example, the insulation spacers 260 are formed of silicon nitride. Subsequently, conductive drain and source regions 280a and 280b are formed by doping the exposed active region, i.e., the active region central part 200A and the active region end parts 200B, with impurity ions using the gate electrode 240 and the sidewall spacer 260 as an ion implantation mask. The impurity ions are of a conductivity type opposite to that of the semiconductor substrate. For example, if the semiconductor substrate has a p-type conductivity, the impurity ions have an n-type conductivity.

Therefore, the completed transistor comprises a gate electrode 240 and the impurity diffusion region (i.e., source and drain regions 280a and 280b) formed at both sides of the gate electrode 240.

Note, also that a lightly doped drain may be formed before the sidewall spacers 260 are formed, using the gate electrode 240 as an ion implantation mask. In this case, the impurity ions of the lightly doped drain have a concentration lower than the concentration of impurity ions implanted after the sidewall spacers 260 are formed.

A subsequent process of forming a bit line and a capacitor will be described with reference to FIGS. 9 and 10.

Figure 9:
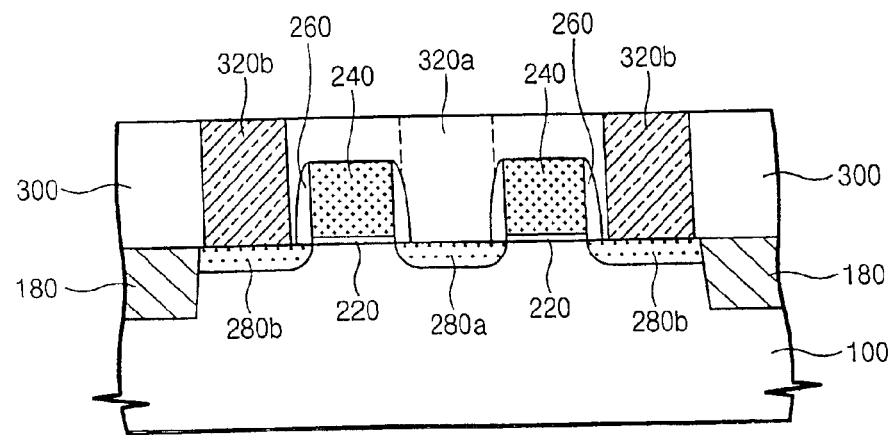

Referring first to FIG. 9, an oxide layer 300 is formed as an interlayer insulation layer on the entire surface of the semiconductor substrate on which the transistor has been formed. Then, openings exposing the drain region 280a and the source region 280b are formed by a patterning process, known per se. The openings are filled with conductive material to form conductive pads 320a and 320b.

Figure 10:
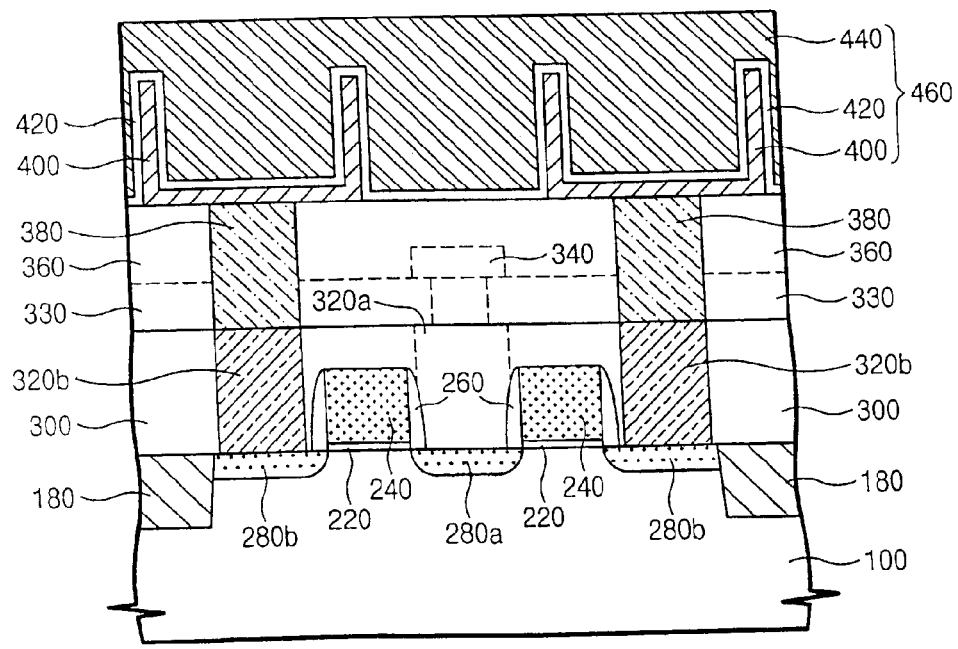

Referring to FIG. 10, a lower insulation layer 330 is then formed on the entire surface of the semiconductor substrate. Next, an opening is formed in the lower insulation layer 330, by a patterning process, to expose the conductive pad 320a that is electrically connected to the drain region 280a. A conductive layer is formed on the lower insulation layer 330 to fill the opening and then is patterned to form a bit line 340. The bit line 340 crosses the gate electrodes 240 at right angles. An upper insulation layer 360 is then formed on the bit line 340 and the lower insulation layer 330.

Next, the upper insulation layer 360 and the lower insulation layer 330 are patterned to form an opening that exposes a conductive pad 320b electrically connected to the source region 280b. The opening is then filled with conductive material to form a plug 380.

A capacitor 460 is formed as electrically connected to the plug 380. The capacitor 460 comprises a lower electrode 400 connected to the plug 380, a dielectric layer 420 formed on the lower electrode 400 and the upper insulation layer 360, and an upper electrode 440 formed on the dielectric layer 420.

Finally, a conventional passivation process is performed.

Figure 11:
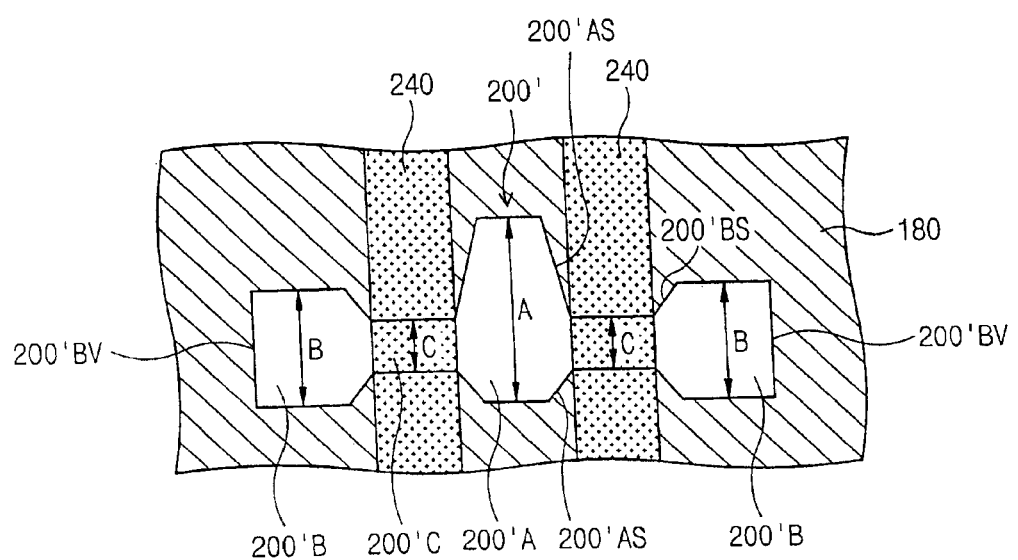
FIG. 11 is a schematic plan view of another transistor according to the present invention.

FIG. 11 shows another embodiment of a transistor according to the present invention. Similarly to the active region of the embodiment of FIG. 2, the active region 200' comprises an active region central part 200'A, active region end parts 200'B, and active region channel parts 200'C Gate electrodes 240 cross over the active region channel parts 200'C, respectively. Each region where an active region channel part 200'C and a gate electrode 240 overlap is rectangular or square.

The width C of the active region channel part 200'C is smaller than the widths A and B of the active region central part 200'A and the active region end parts 200'B. In addition, the width A of the active region central part 200'A is greater than the width B of each active region end part 200'B In this embodiment, the active region end parts 200'B have straight terminal edges 200'BV, respectively, i.e., the straight terminal edges 200'BV are located at the distal ends of the active region. The active region end parts 200'B each have a uniform width B for a substantial portion thereof inwardly of each straight terminal edge 200'BV, and then taper so as to have a narrower portion 200'BS. The narrower portion 200'BS of each active region end part 200'B terminates in vertical alignment with an outer sidewall of a gate electrode 140. (The two sidewalls of the pair of gate electrodes 240 that cross the active region 200' will be referred to as the inner sidewalls of the gate electrodes 240 and the other two sidewalls that do not face each other will be referred to as outer sidewalls). The active region channel parts 200'C extend inwardly from the narrower portions 200'BS of the active region end parts 200'B and terminate in vertical alignment with the inner sidewalls of the gate electrodes 240, respectively. In this case, the active region channel parts 200'C each have a uniform width C. The active region central part 200'A has a maximum width A that is greater than the width C of the active region end parts 200'C The active region central part 200'A tapers outwardly so as to have narrower portions 200'AS that terminate in vertical alignment with the inner sidewalls of the gate electrodes 240, respectively.

In this embodiment, the active region central part 200'A and the active region end parts 200'B may have respective side edges that are aligned (at the bottom boundary of the active region in FIG. 11). On the other hand, the active region 200' protrudes beyond the active region end parts 200'B at the other side of the active region 200' (at the top boundary of the active region 200' in FIG. 11). The side edges of the active region channel parts 200C' are located between the top boundary and the bottom boundary of the active region 200', i.e., in a region between the side edges of the active region central part 200'A and active region end parts 200'B.

According to the present invention as described above, the portions of the active region crossed by the gate electrodes are narrower than the other portions of the active region. Accordingly, even though the minimum line width of the gate electrode is reduced in the case of a more highly integrated device, the threshold voltage does not decrease. As a result, leakage current and hence, device malfunctions, can be prevented.

Moreover, the portions of the active region exposed by the gate electrode are relatively wide, so that an appropriate resistance can be offered by the device. Still further, the portion of the active region located between the gate electrodes is wider than the portions of the active region located on the outer sides of the gate electrodes, thereby facilitating the forming of a COB structure.

Finally, although the present invention has been described in connection with the preferred embodiments thereof, various changes to and modifications of the preferred embodiments can be made without departing from the true spirit and scope of the invention as defined by the appended claims.

What is claimed is:

1. A semiconductor device comprising a semiconductor substrate having an active region, and a device isolation region that defines the active region on the substrate, and wherein the active region includes a central part, end parts, and connection parts extending along a first axis from the central part to the end parts, respectively, so as to connect the central part to the end parts, the connection parts each having a width that is less than each of the maximum widths of the central part and the end parts as measured in the direction of a second axis perpendicular to said first axis.

2. The device of claim 1, wherein the maximum width of the central part of the active region is greater than the maximum width of each of the end parts as measured in the direction of said second axis.

3. The device of claim 1, and further comprising gate electrodes that extend across the connection parts of the active region, respectively, in the direction of said second axis.

4. The device of claim 3, and further comprising a bit line electrically connected to the central part of the active region, and a capacitor electrically connected to a said end part of the active region.

5. The device of claim 4, wherein the capacitor is located over the bit line.

6. The device of claim 1, wherein said substrate has a trench therein, and a layer of insulation material fills said trench and constitutes said device isolation region.

7. The device of claim 6, wherein said central and end parts of the active region are portions of said substrate doped with impurity ions.

8. The device of claim 1, wherein said central and end parts of the active region are portions of said substrate doped with impurity ions.

9. A semiconductor device comprising a semiconductor substrate having an active region, a device isolation region that defines the active region on the substrate, and gate electrodes spaced from one another in the direction of a first axis, the active region having a width that varies along the direction of the first axis, said width being the dimension of the active region measured in the direction of a second axis perpendicular to said first axis, and the gate electrodes extending in the direction of said second axis across the device isolation region and across the portions of the gate electrodes having the smallest width measured in the direction of said second axis.

10. The device of claim 9, wherein a pair of said gate electrodes extends across the active region, the active region having an active region central part located between the pair of gate electrodes, active region end parts, and active region channel parts disposed between the active region central part and the active region end parts, respectively, the gate electrodes extending across the active region channel parts, and the width of the active region at said central part thereof being greater than the width of the active region at said end parts thereof.

11. The device of claim 10, and further comprising a bit line electrically connected to the active region central part, and a capacitor electrically connected to a said active region end part.

12. The device of claim 11, wherein the capacitor is located over the bit line.

13. The device of claim 9, wherein said substrate has a trench therein, and a layer of insulation material fills said trench and constitutes said device isolation region.

14. The device of claim 13, wherein said central and end parts of the active region are portions of said substrate doped with impurity ions.

15. The device of claim 9, wherein said central and end parts of the active region are portions of said substrate doped with impurity ions.

* * * * *